(12) United States Patent
Takada et al.

(10) Patent No.: US 6,621,286 B2
(45) Date of Patent: Sep. 16, 2003

(54) SYSTEM AND METHOD FOR INSPECTING A SEMICONDUCTOR DEVICE WITH CONTACT SECTIONS THAT SLIDE OVER THE TERMINALS OF THE SEMICONDUCTOR DEVICE

(75) Inventors: Shigeru Takada, Tokyo (JP); Isao Asaka, Tokyo (JP); Masahiro Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 17 days.

(21) Appl. No.: 09/754,203

(22) Filed: Jan. 5, 2001

(65) Prior Publication Data

US 2001/0054710 A1 Dec. 27, 2001

(30) Foreign Application Priority Data

Jun. 22, 2000 (JP) ........................................ 2000-188384

(51) Int. Cl.[7] ................................................. G01R 1/73
(52) U.S. Cl. ....................................... 324/765; 324/754
(58) Field of Search ............................... 324/765, 755, 324/754; 439/591, 482, 60–72, 91

(56) References Cited

U.S. PATENT DOCUMENTS

| 5,163,834 | A | * | 11/1992 | Chapin et al. | ............... | 439/591 |
|---|---|---|---|---|---|---|
| 5,800,184 | A | * | 9/1998 | Lopergolo et al. | ........... | 439/591 |
| 6,046,597 | A | * | 4/2000 | Barabi | ........................ | 324/755 |
| 6,222,378 | B1 | * | 4/2001 | Campbell et al. | ............ | 324/754 |
| 6,293,808 | B1 | * | 9/2001 | Ochiai | .......................... | 439/70 |
| 6,474,997 | B1 | * | 11/2002 | Ochiai | .......................... | 439/70 |

* cited by examiner

Primary Examiner—Vinh P. Nguyen
(74) Attorney, Agent, or Firm—McDermott, Will & Emery

(57) ABSTRACT

A system and method suitable for inspecting a semiconductor device whose terminals are formed from solder balls and protrude from a package is provided, thus enabling high-speed inspection of a semiconductor device having a plurality of pins. Metal protuberances corresponding to respective terminals projecting from the bottom of a package of a semiconductor device are provided on an interface substrate. Contact sections corresponding to the respective metal protuberances are provided within each of a plurality of slide sections. The semiconductor device is set on the slide section such that the terminals are disposed opposite the respective metal protuberances. The slide sections are slid over the interface substrate, thereby bringing the side surfaces of the terminals of the semiconductor device into contact with the contact sections. Each of the contact sections is formed from a conductive contact plate, an elastic film, and a slide guide having rigidity.

11 Claims, 4 Drawing Sheets ically been used for inspecting a semiconductor device of ball grid array (BGA) type or a semiconductor device of chip-size package (CSP) type. In FIGS. 9 and 10, reference numeral 10 designates the bottom of a package of a semiconductor device which is an object of inspection. Further, reference numeral 12 designates a solder ball provided as a terminal on the bottom 10 of the package.

SYSTEM AND METHOD FOR INSPECTING A SEMICONDUCTOR DEVICE WITH CONTACT SECTIONS THAT SLIDE OVER THE TERMINALS OF THE SEMICONDUCTOR DEVICE

BACKGROUND OF THE INVENTION

1. Field of the Invention

The present invention relates to a system and method for inspecting a semiconductor device, and more particularly, to a system and method suitable for inspecting a semiconductor device whose terminals are formed from solder balls and protrude from a package.

2. Description of the Background Art

FIGS. 9 and 10 show inspection sockets which have conventionally been used for inspecting a semiconductor device of ball grid array (BGA) type or a semiconductor device of chip-size package (CSP) type. In FIGS. 9 and 10, reference numeral 10 designates the bottom of a package of a semiconductor device which is an object of inspection. Further, reference numeral 12 designates a solder ball provided as a terminal on the bottom 10 of the package.

An inspection socket 14 shown in FIG. 9 is of leaf spring type. A leaf spring 16 is provided on an interface substrate (simply called IF substrate) 15. Further, the inspection socket 14 is provided with a slide guide for adjusting the position of the leaf spring 16. The leaf spring 16 clamps the solder ball 12 from both sides thereof by means of elastic force of the leaf spring 16, thus achieving desired contact.

An inspection socket 17 shown in FIG. 10 is of POGO type, and has an extendable POGO pin 18 provided on the IF substrate 15. A semiconductor device is set on the IF substrate 15 such that each of the POGO pins 18 comes into contact with the corresponding solder ball 12, whereby the inspection socket 17 of this type can achieve desired contact.

In the case of the inspection socket 14 of leaf spring type shown in FIG. 9, the leaf spring 14 must provide sufficient elastic force. Therefore, a comparatively long distance; particularly, a distance of about 10 mm, must be ensured between the IF substrate 15 and the solder ball 12. Inductance arising between the IF substrate 15 and the solder ball 12 increases with the distance therebetween. A signal exchanged between the IF substrate 15 and the solder ball 12 is degraded in, particularly, a high-frequency range, as inductance existing between the IF substrate 15 and the solder ball 12 becomes greater. For this reason, the inspection socket 14 of leaf spring type is not suitable for high-speed testing of a semiconductor device.

The inspection socket 17 of POGO pin type shown in FIG. 10 achieves desired contact by means of applying contact pressure to the solder ball 12 from below. The contact pressure acts as a load on a package of the semiconductor device. The load imposed on the package increases with the number of pins of the semiconductor device. If excessive load is exerted on the package, the semiconductor element provided within the package will be damaged. For this reason, the inspection socket 17 of POGO pin type has a problem of being likely to inflict damage on a semiconductor device having a plurality of pins.

SUMMARY OF THE INVENTION

The present invention has been conceived to solve such a drawback of the background art and is aimed at providing an inspection system for inspecting at high speed a semiconductor device having a plurality of pins.

The present invention is also aimed at providing an inspection method of inspecting at high speed a semiconductor device having a plurality of pins.

Other objects and further features of the present invention will be apparent from the following detailed description when read in conjunction with the accompanying drawings.

DESCRIPTION OF THE PREFERRED EMBODIMENTS

Figure 1:
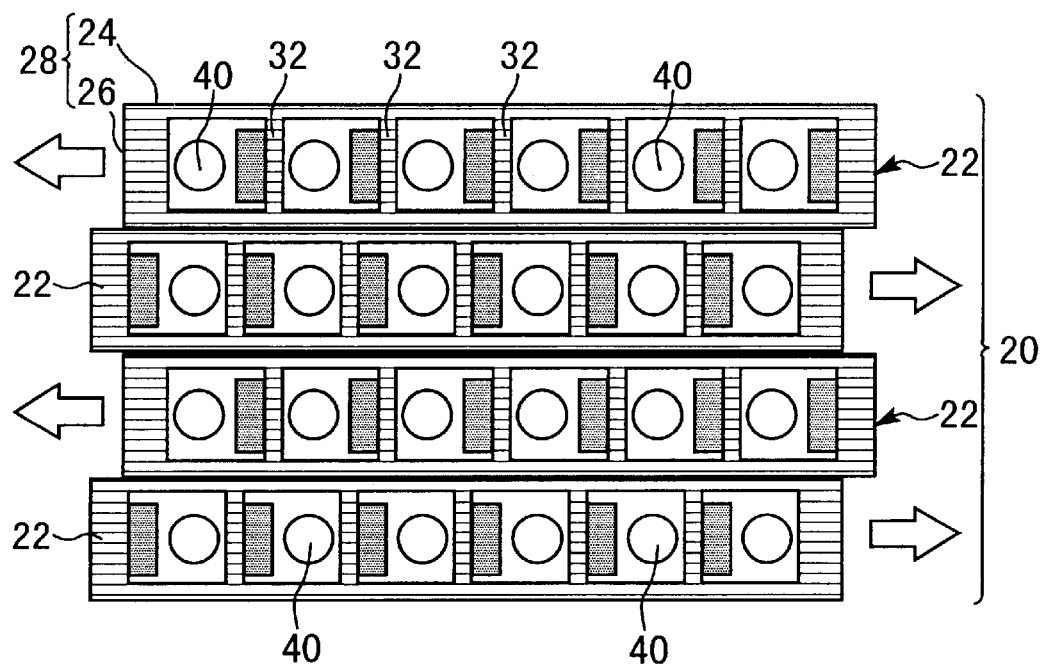
FIG. 1 is a plan view showing a principal section of an inspection system according to a first embodiment of the present invention.

Preferred embodiments of the present invention will be described hereinafter by reference to the accompanying drawings. Throughout the drawings, like reference numerals designate like elements, and repetition of their explanations is omitted.

First Embodiment

FIG. 1 is a plan view showing a principal section of an inspection system according to a first embodiment of the present invention. The inspection system according to the present embodiment is for inspecting a semiconductor device of BGA or CSP type. The inspection system has an inspection socket 20 for establishing an electrical connection with solder balls which are provided as terminals on a semiconductor device to be inspected. The inspection socket 20 has a plurality of slide sections 22. The slide sections 22 are provided on an IF substrate (not shown in FIG. 1) so as to be able to slide rightward and leftward in FIG. 1.

Figure 2:
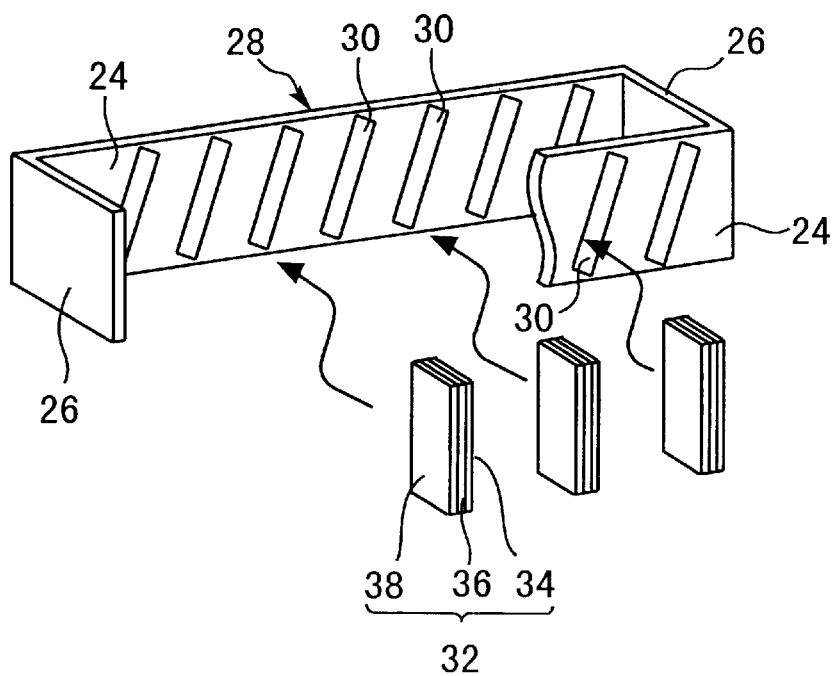
FIG. 2 is a perspective view showing construction of a slide section shown in FIG. 1.

FIG. 2 is a perspective view showing one of the slide sections 22. As shown in FIG. 2, each of the slide sections 22 has an outer frame 28 comprising two longitudinal plates 24 and two lateral plates 26. A plurality of tilt slits 30 are formed at predetermined pitches on each of the two longitudinal plates 24.

The slide section 22 has a plurality of contact sections 32. The contact section 32 is a multilayered plate formed by laminating a slide guide 34 having rigidity, an elastic film 36 (for example, a silicon film) having elasticity, and a conductive contact plate 38, in the sequence given. The contact section 32 is inserted into the tilt slit 30 and is mounted on the outer frame 28.

As shown in FIG. 1, the interior space defined by each slide section 22 is partitioned into a plurality of sub-spaces by means of the previously-described contact sections 32. A plurality of metal protuberances 40 are formed on the IF substrate 15 (not shown in FIG. 1) located below the slide section 22 at the same pitch as used for arrangement of the solder balls of the semiconductor device to be inspected. The slide section 22 is placed on the IF substrate 15 such that metal protuberances 40 are located in the respective sub-spaces defined by the contact sections 32 and the outer frame 28.

More specifically, in the present embodiment, the contact section 32 is located on the right side of the metal protuberance 40 in the $n^{th}$ slide section 22 (i.e., the first and third slide sections shown in FIG. 1). The slide sections 22 are mounted on the IF substrate 15 such that the contact sections 32 can be brought into contact with the metal protuberances 40 by means of sliding the slide sections 22 leftward. In the $n+1^{th}$ and $n-1^{th}$ slide sections 22, which are adjacent to the nth slide section 22, (i.e., the second and fourth rows of slide sections 22 shown in FIG. 1) are located on the left side of the contact sections 32 of the metal protuberances 40. The slide sections 22 are mounted on the IF substrate 15 so that the contact sections 32 can be brought into contact with the metal protuberances 40 by means of sliding the slide sections 22 rightward. In the inspection system according to the present embodiment, the plurality of slide sections 22 are slid in alternating directions from row to row, to thereby bring the contact sections 32 into contact with the metal protuberances 40.

The structure and function of the slide section 22 will be described in more detail by reference to FIG. 3.

Figure 3:
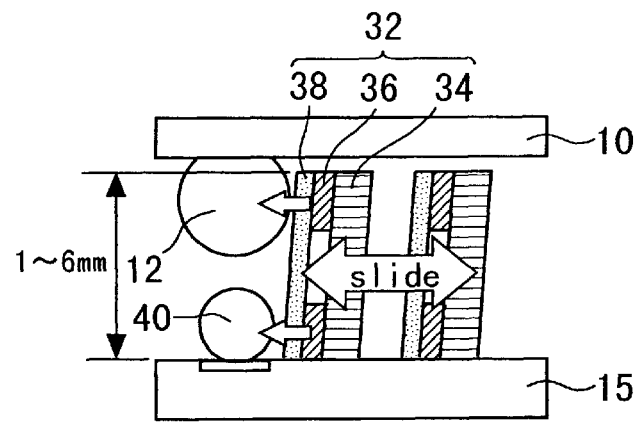
FIG. 3 is a side view showing a part of the slide section shown in FIG. 1.
Figure 9:
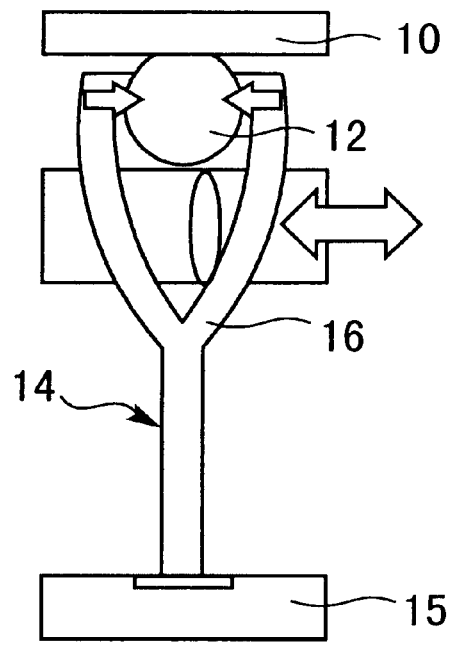
FIG. 9 is a side view showing construction of a conventional inspection socket.
Figure 10:
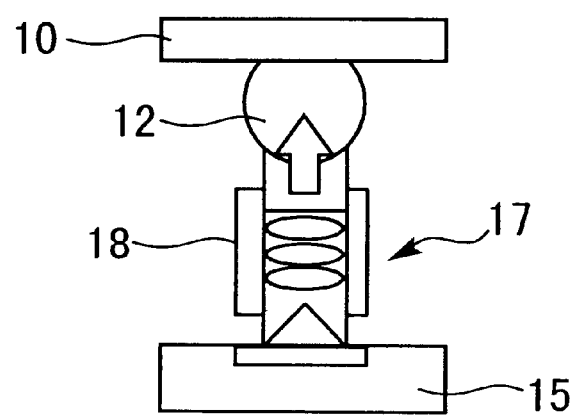
FIG. 10 is a side view showing construction of another conventional inspection socket.

FIG. 3 is a side view showing one of the sub-spaces defined in the slide section 22 by the contact section 32. In FIG. 3, reference numeral 10 designates the bottom of a package of a semiconductor device; 12 designates solder balls provided as terminals on the bottom 10; and 15 designates an IF substrate of the inspection system, as in the case of the inspection system shown in FIG. 9 or 10.

The metal protuberances 40 provided on the surface of the IF substrate 15 are formed by means of plating with gold a ball which has a diameter of 1 to 2 mm and is formed from, for example, stainless steel (SUS). The metal protuberances 40 act as terminals of the IF substrate 15. The metal protuberances 40 are embedded in or soldered to the IF substrate 15. In the present embodiment, the metal protuberances 40 are formed in a spherical shape. However, the metal protuberances 40 may be formed into a columnar shape, a truncated cone shape, a polygonal columnar shape, or a polygonal truncated cone shape.

The contact section 32 has the conductive contact plate 38 so as to oppose the metal protuberance 40. The contact sections 32 are slid in conjunction with the slide sections 22 (see FIG. 1) and can come into contact with both the metal protuberances 40 and the solder balls 12. As mentioned above, the contact section 32 has the elastic film 36, and the elastic force of the elastic film 36 generates contact force upon making contact with the metal protuberance 40 and the solder ball 12. Further, the elastic force of the elastic film 36 absorbs variations in the size of the solder ball 12. Therefore, according to the present invention, there is no necessity of imparting elasticity to the contact plate 38 itself, and hence the length of the contact plate 38 can be made sufficiently short (a length of about 1 to 6 mm).

Resistance arising between the solder ball 12 and the metal protuberance 40 becomes lower as the contact plate 38 becomes shorter. Further, the lower the resistance arising between the solder ball 12 and the metal protuberance 40, the faster inspection of the semiconductor device can be completed. Accordingly, the inspection system according to the present embodiment enables high-speed inspection of a semiconductor device, because of the short length of the contact plate 38.

In the present embodiment, the contact section 32 comes into contact with the side surface of the solder ball 12, as shown in FIG. 3. As mentioned above, the slide sections 22 are slid in alternating directions from row to row, whereby each of the contact sections 32 is brought into contact with the corresponding metal protuberance 40 and solder ball 12. As a result, the contact force exerted on each solder ball 12 is canceled as a whole. For this reason, in the inspection system according to the present embodiment, the slide sections 22 are slid in predetermined directions, thereby appropriately adjusting the relative position between the semiconductor device and the IF substrate 15 to a stable state.

In the present embodiment, no longitudinal pressing force acts on individual solder ball 12. When the inspection socket 20 is attached to the package of the semiconductor device, no great force is exerted on the bottom 10 of the package. Accordingly, even in a case where a semiconductor device has a plurality of pins, the inspection system according to the present embodiment effects a stable inspection operation while preventing occurrence of shearing or fracture in the bottom 10 of the package.

Figure 4:
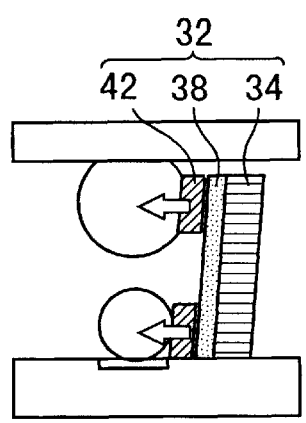
FIG. 4 is a side view of another contact section which may be employed in the inspection system according to the first embodiment of the present invention.

In the first embodiment, the elastic film 36 is interposed between the contact plate 38 and the slide guide 34, to thereby impart elasticity to the contact section 32. However, the structure for imparting elasticity to the contact section 32 is not limited to such an embodiment. For example, as shown in FIG. 4, affixing an elastic anisotropic conductive film 42 onto the surface of the contact plate 36 can ensure desired elasticity.

Figure 5:
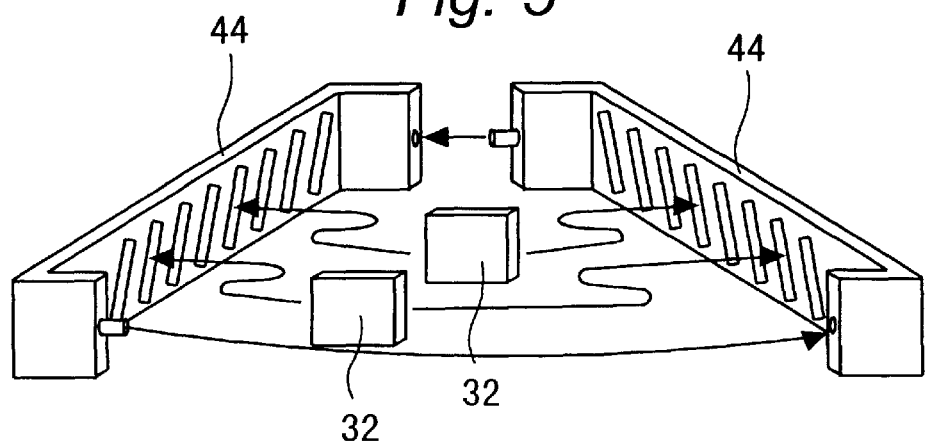
FIG. 5 is a perspective view of another slide section which may be employed in the inspection system according to the first embodiment of the present invention.

In the first embodiment, the slide section 22 is embodied by means of inserting the contact section 32 into the tilt slits 30 formed in the outer frame 28. However, the structure of the slide section 22 is not limited to such a structure. For example, as shown in FIG. 5, the slide section 22 may be embodied by means of sandwiching the contact sections 32 between sub-sections of a two-piece outer frame 44.

Second Embodiment

Figure 6:
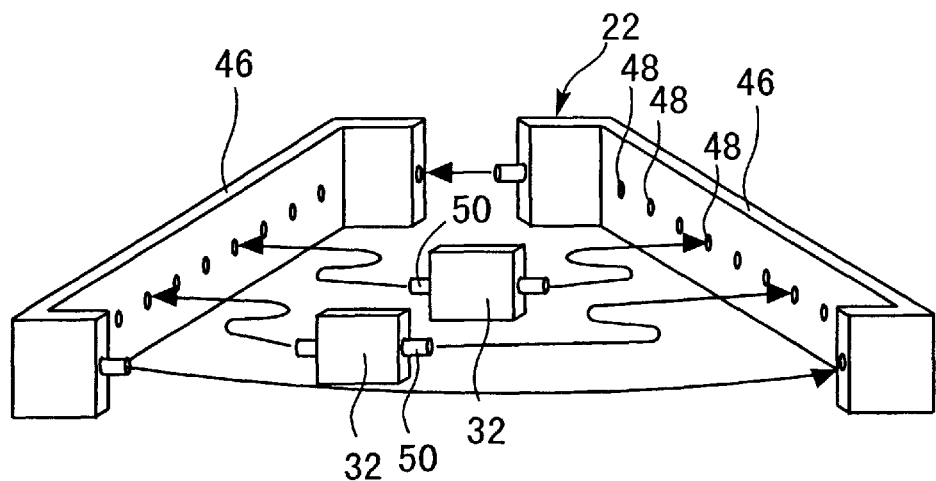
FIG. 6 is a perspective view showing construction of a slide section provided in a second embodiment of the present invention.

A second embodiment of the present invention will be described by reference to FIGS. 6 through 8. FIG. 6 is a perspective view showing the slide section 22 of the inspection socket according to the present embodiment. As in the case of the first embodiment, a plurality of slide sections 22 are arranged so as to be slid in opposite directions (see FIG. 1).

In the present embodiment, the slide section 22 comprises a two-piece outer frame 46 and a plurality of contact sections 32. A plurality of bearing holes 48 are formed at predetermined pitches in the outer frame 46. A rotary axis 50 to be fitted into a corresponding shaft bearing hole 48 is provided on either side of the contact section 32. In the present embodiment, the rotary axes 50 of the contact section 32 are held by the corresponding bearing holes 48, wherewith the contact section 32 is held between the sub-sections of the two-piece outer frame 46 in a rotatable manner.

Figure 7:
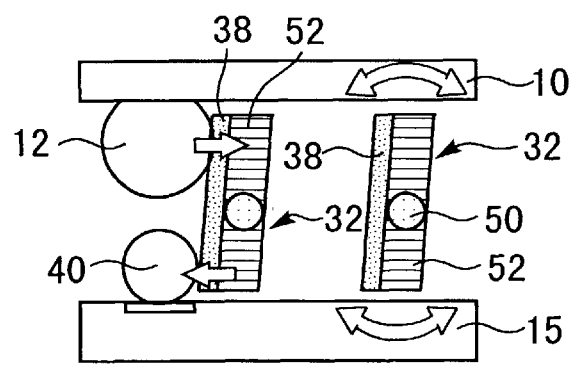
FIG. 7 is a side view of a part of the slide section shown in FIG. 6.
Figure 8:
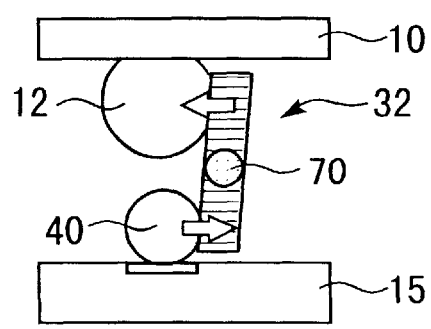
FIG. 8 is a side view of another contact section which may be employed in the inspection system according to the second embodiment of the present invention.

FIG. 7 is a side view showing the interior space of a partition which is formed in the slide section 22 by means of the contact sections 32. As shown in FIG. 7, as in the case of the first embodiment, the metal protuberances 40 are provided on the surface of the IF substrate 15. The semiconductor device is situated on the slide section 22 such that the respective solder balls 12 correspond to the respective metal protuberances 40.

In the present embodiment, the contact section 32 is formed by means of laminating a conductive contact plate 38 onto an injection-molded member 52 having rigidity. More specifically, the contact section 32 is formed without use of the elastic film that is required in the first embodiment. Instead, the injection-molded member 52 has the rotary axes 50 on either side thereof.

When the slide section 20 is slid in a predetermined direction (see FIG. 1), the contact plate 54 can come into contact with both the metal protuberance 40 and the solder ball 12. At this time, the contact section 32 is retained in a rotatable manner, and hence variation in the size and position of solder balls 12 is absorbed by rotation of the contact section 32. Accordingly, without respect to whether or not the contact section 32 has a elastic film, all the solder balls 12 of the semiconductor device can attain appropriate electrical connection with the metal protuberances 40 provided on the IF substrate 15.

In the present embodiment, since the contact sections 32 do not require a elastic film, the contact sections 32 can be made thinner than those employed in the first embodiment. The inspection system and the inspection method according to the second embodiment can be applied to inspection of a semiconductor device on which the solder balls 12 are arranged at narrow pitches of less than 1.0 mm.

In the second embodiment, the contact section 32 is formed by means of laminating the contact plate 38 onto the injection-molded member 52. However, the structure of the contact section 32 is not limited to such a structure. For example, as shown in FIG. 8, the contact section 32 may be formed from only a single conductive plate, by means of punching a metal plate of BeCu or the like. In this case, the contact section 32 can be made much thinner than that shown in FIG. 7, thereby enabling formation of solder balls 12 at narrower pitches.

In the second embodiment, elasticity is not imparted to the contact sections 32. However, the present invention is not limited to such an embodiment. More specifically, even in a case where the contact section 32 is rotatable, elasticity can be imparted to the contact sections 32 in the same manner as in the case of the first embodiment.

In the first and second embodiments of the present invention, the terminals of a semiconductor device are limited to the solder balls 12. However, the present invention is not limited to such embodiments. More specifically, the inspection system and method according to the present invention are effective for inspecting all types of semiconductor device in which terminals project from a package, including a semiconductor device having solder balls.

Since the present invention has been embodied in the manner as mentioned previously, the invention yields the following advantages.

According to a first aspect of the present invention, a contact section is brought into contact with the side surface of a terminal of a semiconductor device, thereby enabling establishment of electrical connection between the terminal and a metal protuberance provided on an interface substrate. Accordingly, even in a case where a package of a semiconductor device has a plurality of terminals, the inspection system according to the present invention can prevent exertion of excessive stress onto the package without fail.

According to a second aspect of the present invention, contact sections can be brought into contact with terminals which are provided on a semiconductor device in a plurality of rows, from alternating directions. The contact force imposed on each terminal of the semiconductor device is canceled. Thus, the package can be placed in position without involvement of application of longitudinal stress onto the package.

According to a third aspect of the present invention, since the contact section has a length of 1 to 6 mm, resistance arising between a terminal of a semiconductor device and a metal protuberance provided on an interface substrate can be made sufficiently low. Thus, the present invention enables high-speed testing of a semiconductor device.

According to a fourth aspect of the present invention, since the contact section is provided in a rotatable manner, variation in the position and dimension of a terminal of a semiconductor device can be absorbed by means of rotation of the contact section.

According to a fifth aspect of the present invention, a contact section can be held on an outer frame of a slide section through use of a simple structure.

According to a sixth aspect of the present invention, the contact section is formed from a multilayered film, the film comprising a contact plate, a elastic film, and a slide guide. Therefore, according to the present invention, variations in the position and dimension of a terminal of a semiconductor device are absorbed by a elastic film, as a result of which a desired contact force arises in the elastic film.

According to a seventh aspect of the present invention, the contact section is formed from a multilayered film, the film comprising an anisotropic conductive film, a contact plate, and a slide guide. Therefore, variations in the position and dimension of a terminal provided on the semiconductor device are absorbed by an anisotropic conductive film. A desired contact force can be generated in an anisotropic conductive film.

According to an eighth aspect of the present invention, the contact section is formed from only a contact plate or from only a contact plate and a molded member. Therefore, in contrast with a case where the contact section includes a elastic film or an anisotropic conductive film, the contact section can be made thinner. Thus, the present invention enables appropriate inspection of a semiconductor device in which terminals are provided at sufficiently small pitches.

According to a ninth aspect of the present invention, a semiconductor device can be appropriately inspected without imparting damage to the semiconductor device and through use of the inspection system.

Further, the present invention is not limited to these embodiments, but variations and modifications may be made without departing from the scope of the present invention.

The entire disclosure of Japanese Patent Application No. 2000-188384 filed on Jun. 22, 2000 including specification, claims, drawings and summary are incorporated herein by reference in its entirety.

What is claimed is:

1. An inspection system for inspecting a semiconductor device whose terminals protrude from the bottom surface of a package, the system comprising:

metal protuberances provided on an interface substrate so as to correspond to the respective terminals of the semiconductor device; and contact sections which slide over the interface substrate and come into contact with the side surfaces of the terminals of the semiconductor device and the side surfaces of the metal protuberances, to thereby establish electrical connection with the terminals and the metal protuberances.

2. The inspection system according to claim 1, wherein:

the terminals of the semiconductor device are arranged into a plurality of rows; and the contact sections provided so as to correspond to the terminals of respective rows come into contact with the terminals in alternating directions from row to row.

3. The inspection system according to claim 1, wherein the contact section measures from 1 mm to 6 mm.

4. The inspection system according to claim 1, wherein each of the contact sections has a rotary axis placed in parallel with the interface substrate and in a position lower than the terminals of the semiconductor device and higher than the metal protuberances.

5. The inspection system according to claim 1, wherein:

a slide section outer frame is provided on the interface substrate in a slidable manner; and the contact sections are sandwiched between sub-sections of a two-piece slide section outer frame thereby being fixed on the slide section outer frame.

6. The inspection system according to claim 1, wherein:

each of the contact sections is formed from a multilayered film, the film comprising a conductive contact plate, a elastic film, and a slide guide having rigidity; and the contact plate is disposed opposite the metal protuberance.

7. The inspection system according to claim 1, wherein:

each of the contact sections is formed from a multilayered film, the film comprising an elastic anisotropic conductive film, a conductive contact plate, and a slide guide having rigidity; and the anisotropic conductive film is disposed opposite the metal protuberance.

8. The inspection system according to claim 4, wherein each of the contact sections is formed from only a conductive contact plate.

9. The inspection system according to claim 4, wherein each of the sections is formed from a conductive contact plate and a molded member which has rigidity and rotary axes.

10. An inspection method for inspecting a semiconductor device, the method comprising the steps of:

setting a semiconductor device on an interface substrate of the inspection system according to claim 1;

sliding the contact sections, to thereby establish electrical connection between the metal protuberances and the terminals of the semiconductor device; and inspecting the semiconductor device by exchanging a signal between the interface substrate and the semiconductor device.

11. An inspection system for inspecting a semiconductor device whose terminals protrude from the bottom surface of a package, the system comprising:

metal protuberances provided on an interface substrate so as to correspond to the respective terminals of the semiconductor device;

contact sections which slide over the interface substrate and come into contact with the side surfaces of the terminals of the semiconductor device and the side surfaces of the metal protuberances, to thereby establish electrical connection with the terminals and the metal protuberances; and a slide section outer frame provided on the interface substrate in a slidable manner, wherein a plurality of slits are formed in the slide section outer frame, and the contact sections are inserted into said slits, thereby being fixed on the slide section outer frame.

* * * * *